(12) United States Patent
Nakazawa et al.

(10) Patent No.: US 8,362,623 B2
(45) Date of Patent: Jan. 29, 2013

(54) SEMICONDUCTOR DEVICE AND METHOD FOR MANUFACTURING THE SAME

(75) Inventors: Makoto Nakazawa, Osaka (JP); Mitsunobu Miyamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 3 days.

(21) Appl. No.: 13/133,891

(22) PCT Filed: Jul. 27, 2009

(86) PCT No.: PCT/JP2009/003532
§ 371 (c)(1),
(2), (4) Date: Jun. 9, 2011

(87) PCT Pub. No.: WO2010/073425
PCT Pub. Date: Jul. 1, 2010

(65) Prior Publication Data
US 2011/0241219 A1    Oct. 6, 2011

(30) Foreign Application Priority Data

Dec. 24, 2008  (JP) .................................. 2008-328160

(51) Int. Cl.
*H01L 29/40* (2006.01)
*H01L 23/48* (2006.01)
*H01L 21/4763* (2006.01)

(52) U.S. Cl. ................ 257/774; 257/621; 257/E23.011; 257/E23.597; 438/629; 438/637

(58) Field of Classification Search .................. 257/752, 257/758, 774, E23.011, E21.597; 438/672, 438/675

See application file for complete search history.

(56) References Cited

U.S. PATENT DOCUMENTS

| | | | | |
|---|---|---|---|---|
| 4,872,050 A | * | 10/1989 | Okamoto et al. | ............. 257/758 |
| 6,137,182 A | * | 10/2000 | Hause et al. | .................. 257/774 |
| 2002/0135072 A1 | * | 9/2002 | Han et al. | ...................... 257/774 |

FOREIGN PATENT DOCUMENTS

| | | |
|---|---|---|
| JP | 3-167840 A | 7/1991 |
| JP | 3-268326 A | 11/1991 |
| JP | 8-203876 A | 8/1996 |
| JP | H9-330976 A | 12/1997 |
| JP | 2004-6837 A | 1/2004 |

OTHER PUBLICATIONS

International Search Report (ISR) issued in PCT/JP2009/003532 (International application) mailed in Aug. 2009 for Examiner consideration.

* cited by examiner

*Primary Examiner* — Jasmine Clark
(74) *Attorney, Agent, or Firm* — Chen Yoshimura LLP

(57) ABSTRACT

A first contact hole that passes through a planarizing film layered on a first interlayer insulating film, a second interlayer insulating film that covers the surface of the planarizing film and the inner surface of the first contact hole, a third interlayer insulating film layered on the second interlayer insulating film, and a second contact hole formed with a small inner diameter inside the first contact hole and passing through the first to the third interlayer insulating films are formed. Over the third interlayer insulating film and inside the second contact hole, a second conductive film electrically connected to a first conductive film is formed.

13 Claims, 6 Drawing Sheets

SEMICONDUCTOR DEVICE AND METHOD FOR MANUFACTURING THE SAME

TECHNICAL FIELD

The present invention relates to a semiconductor device applicable to liquid crystal display devices and the like, for example, and to a method for manufacturing the same.

BACKGROUND ART

A liquid crystal display device, for example, includes a TFT substrate on which a plurality of TFTs (thin film transistors) and pixel electrodes connected to the TFTs are arranged in a matrix, an opposite substrate facing the TFT substrate and having a color filter, a common electrode, and the like formed thereon, and a liquid crystal layer provided between the opposite substrate and the TFT substrate.

Here, configuration of a TFT substrate 100 is described with reference to FIG. 10, which is an enlarged cross-sectional view. Over a glass substrate 101 that constitute the TFT substrate 100, a lower layer gate electrode 102, a base coat layer 103, a semiconductor layer 104, and a gate insulating film 105 are layered. On the gate insulating film 105, an upper layer gate electrode 106, which is made of a metal material, is formed. The upper layer gate electrode 106 is covered by a first interlayer insulating film 107 and a second interlayer insulating film 108. On the surface of the second interlayer insulating film 108, a lower layer gate wiring 109, an upper layer gate wiring 110, and a drain wiring 111 are formed.

In recent years, development of so-called system liquid crystal, in which driver circuit and the like are directly formed on the glass substrate that constitute a TFT substrate, has been underway for higher functionality and further refinement of liquid crystal display devices. Furthermore, size reduction (narrowing) of the frame region, which is a non-display region surrounding the display region, is also being sought. However, size reduction of wiring layers such as source wiring is more difficult than the case of semiconductor layers or insulating films.

As a result, as shown in FIG. 10, in a region where the upper layer gate electrode 106, which has a large thickness, is formed, the surface of the second interlayer insulating film 108 significantly rises and results in a level difference. Consequently, when the upper layer gate wiring 110 and the like are patterned by photolithography, the patterning precision is inevitably lowered, possibly causing leakage defects or wire breakage in the wiring layer. For example, as shown in FIG. 10 and FIG. 11, in the corner surrounding the raised portion of the second interlayer insulating film 108, unnecessary wiring layer is difficult to remove completely, and therefore residue 112 can remain. The residue 112 can trigger leakage defects between wirings. FIG. 11 is a photograph showing an enlarged view of the residue 112 formed on the second interlayer insulating film 108.

In a known technique to solve this problem, the substrate surface is planarized using an SOG (spin on glass) film. The SOG film, however, is prone to absorb moisture. Therefore, if, in FIG. 10, an SOG film is formed on the second interlayer insulating film 108, and a wiring layer is formed directly in the contact hole that passes through the SOG film, there occurs a problem that the wiring layer can be oxidized by the SOG film, which contains moisture.

On the other hand, Patent Document 1 discloses that a PTEOS-NSG film, which is an oxidation resistant film, is applied on the inner surface of a via hole formed in the SOG film. That is, first, a lower section wiring layer 116, a PTEOS-NSG film 117, an SOG film 118, and a PTEOS-NSG film 119 are layered over a base insulating film 115 in this order (see FIG. 12). Then, a contact hole 120 is formed in the layered body to expose the PTEOS-NSG film 117. Next, a PTEOS-NSG film 121 is formed to cover the SOG film 118 and the PTEOS-NSG film 119, which are exposed inside the contact hole 120. Then, a contact hole 122 is formed in the PTEOS-NSG film 117 to expose the lower section wiring layer 116. Subsequently, an upper section wiring layer 123 is formed on the surface of the PTEOS-NSG film 119 and inside the contact hole 122 to electrically connect the upper section wiring layer 123 and the lower section wiring layer 116 together.

With this configuration, the PTEOS-NSG film 121 is interposed between the SOG film 118 and the upper section wiring layer 123 to prevent oxidation of the upper section wiring layer 123 by the SOG film 118.

RELATED ART DOCUMENTS

Patent Documents

Patent Document 1: Japanese Patent Application Laid-Open Publication No. H9

SUMMARY OF THE INVENTION

Problems to be Solved by the Invention

However, in Patent Document 1, the PTEOS-NSG film 121, which is interposed between the SOG film 118 and the upper section wiring layer 123, itself has hygroscopic property, and therefore the upper section wiring layer 123 can still be possibly oxidized. Therefore, the reliability of such configuration must be questioned.

The present invention was devised to address the issues described above, and is aiming at reliably preventing the oxidation of the conductive film inside the contact hole in a semiconductor device in which a planarizing film is formed.

Means for Solving the Problems

In order to achieve the objectives described above, the semiconductor device of the present invention includes: a first conductive film formed on an insulating substrate; a first interlayer insulating film that covers the first conductive film; a planarizing film layered over the first interlayer insulating film; a first contact hole that passes through the planarizing film; a second interlayer insulating film that covers the surface of the planarizing film and the inner surface of the first contact hole; a third interlayer insulating film layered over the second interlayer insulating film; a second contact hole formed inside the first contact hole with a smaller inner diameter than the first contact hole, and passing through the first interlayer insulating film, the second interlayer insulating film, and the third interlayer insulating film; and a second conductive film that is formed over the third interlayer insulating film and inside the second contact hole, and that is electrically connected to the first conductive film.

The first contact hole may be formed to extend from the planarizing film to a portion of the first interlayer insulating film.

The planarizing film may be composed of an SOG film.

The second interlayer insulating film may be composed of a silicon nitride film. Further, the first interlayer insulating film may be composed of a silicon nitride film.

The third interlayer insulating film may be composed of $SiO_2$.

The method for manufacturing the semiconductor device of the present invention includes the steps of: forming a first conductive film on an insulating substrate; forming a first interlayer insulating film over the insulating substrate to cover the first conductive film; forming a planarizing film on the surface of the first interlayer insulating film; forming a first contact hole that passes through the planarizing film; forming a second interlayer insulating film that covers the surface of the planarizing film and the inner surface of the first contact hole; layering a third interlayer insulating film on the surface of the second interlayer insulating film; forming a second contact hole inside the first contact hole with a smaller inner diameter than the first contact hole, the second contact hole passing through the first interlayer insulating film, the second interlayer insulating film, and the third interlayer insulating film; forming a second conductive film over the third interlayer insulating film and inside the second contact hole to electrically connect the second conductive film to the first conductive film.

In the step of forming the first contact hole, the first contact hole may be formed to extend from the planarizing film to a portion of the first interlayer insulating film.

Furthermore, the step of forming the first contact hole may include a first etching process in which, in a region where the first contact hole is to be formed, only the planarizing film is etched to form a through hole, and a second etching process in which the first interlayer insulating film, which is exposed at the bottom of the through hole, and the planarizing film around the through hole are etched simultaneously.

The planarizing film may be composed of an SOG film.

The second interlayer insulating film may be composed of a silicon nitride film. Further, the first interlayer insulating film may be formed of a silicon nitride film.

The third interlayer insulating film may be made of $SiO_2$.

Operations

Next, operations of the present invention are described.

In the aforementioned semiconductor device, both the surface of the planarizing film and the sides of the planarizing film constituting the inner surface of the first contact hole are covered with the single second interlayer insulating film. The second interlayer insulating film can prevent impurities from releasing from the planarizing film. As a result, the second conductive layer that is inside the first contact hole is prevented from being oxidized. Further, because the second contact hole is formed inside the first contact hole, the aspect ratio of the second contact hole is lowered. Consequently, the etching damage that the first conductive film might suffer during the formation of the second contact hole can be reduced. Also, because etching time is shortened and thereby over-etching can be suppressed, the present invention is effective for miniaturization of the second contact hole.

If the first interlayer insulating film and the second interlayer insulating film are made of silicon nitride, for example, impurity release from the planarizing film can be prevented more suitably. Also, preferably the first contact hole is formed to extend from the planarizing film to a portion of the first interlayer insulating film, because this way the aspect ratio of the second contact hole can further be reduced.

The aforementioned semiconductor device is manufactured as follows. First, a first conductive film is formed on an insulating substrate. Next, over the insulating substrate, a first interlayer insulating film is formed to cover the first conductive film. Then, on the surface of the first interlayer insulating film, a planarizing film made of an SOG film or the like, for example, is formed. Next, a first contact hole that runs through the planarizing film is formed.

The first contact hole may be, as described above, formed to extend from the planarizing film to a portion of the first interlayer insulating film. In this case, for example, first, the first etching process is conducted to etch only the planarizing film in the region where the first contact hole is to be formed to form a through hole. Subsequently, the second etching process can be conducted to etch the first interlayer insulating film, which is exposed at the bottom of the through hole, and the planarizing film around the through hole simultaneously. This allows reduction in the aspect ratio of a second contact hole, which is formed in a later process.

Subsequently, a second interlayer insulating film is formed to cover the surface of the planarizing film and the inner surface of the first contact hole. Then, a third interlayer insulating film is layered over the surface of the second interlayer insulating film. Next, a second contact hole that passes through the first interlayer insulating film, the second interlayer insulating film, and the third interlayer insulating film is formed inside the first contact hole with a smaller inner diameter than the first contact hole. Then, a second conductive film is formed on the third interlayer insulating film and inside the second contact hole to electrically connect the second conductive film to the first conductive film. The aforementioned semiconductor device is manufactured in this way.

Effects of The Invention

According to the present invention, the second conductive film can be formed as planarized while higher integration of the semiconductor device is achieved. Additionally, both the surface of the planarizing film and the side surface of the planarizing film that constitutes the inner surface of the first contact hole can be covered by a single second interlayer insulating film, and the second interlayer insulating film can prevent the impurities from releasing from the planarizing film, thereby making it possible to reliably prevent oxidation of the second conductive layer inside the first contact hole. Furthermore, when the second contact hole is formed, its aspect ratio can be lowered to reduce the etching damage on the first conductive film and the like. Furthermore, etching time can be shortened to suppress the over-etching, and therefore the second contact hole can suitably be miniaturized.

DETAILED DESCRIPTION OF EMBODIMENTS

Embodiments of the present invention are described in detail with reference to figures below. However, the present invention is not limited to the following embodiments.

Embodiments of the Present Invention

FIGS. 1 to 5 show embodiments of the present invention.

Figure 1:
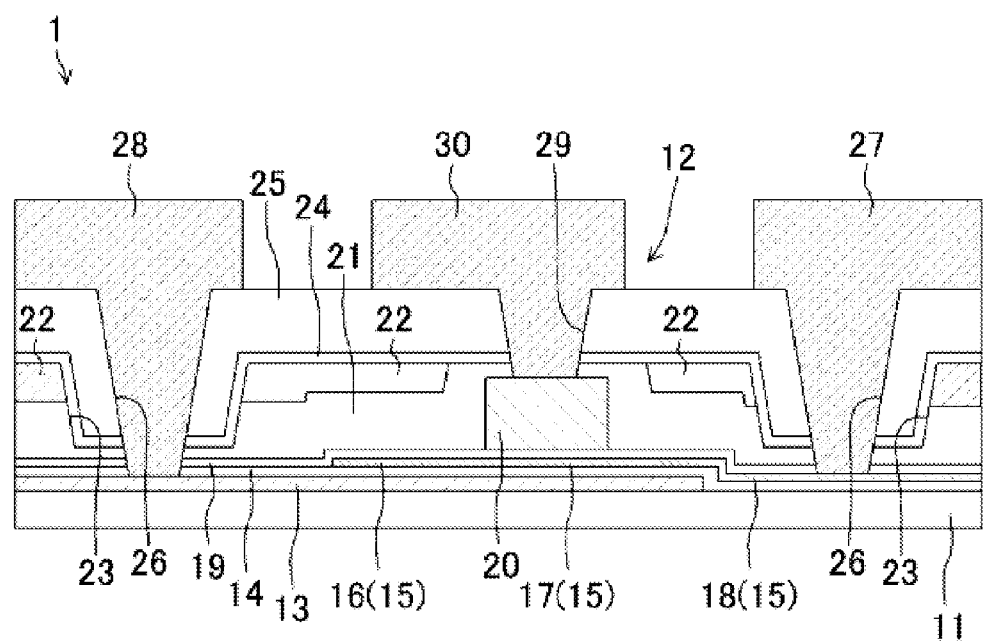
FIG. 1 is an enlarged cross-sectional view, illustrating the structure of a semiconductor device according to an embodiment of the present invention.

FIG. 1 is an enlarged cross-sectional view showing the structure of semiconductor device 1 according to an embodiment of the present invention. FIGS. 2 to 5 are cross-sectional views illustrating a manufacturing process of the semiconductor 1.

Configuration of the Semiconductor Device

The semiconductor device 1 is configured as a device that includes a MOS transistor 12 formed on a glass substrate 11, which is an insulating substrate. Although not illustrated, the semiconductor device 1 constitutes a display panel of a liquid crystal display device, for example.

Although not illustrated, a liquid crystal display device includes a TFT substrate with a plurality of TFTs as switching elements formed thereon, an opposite substrate that is disposed to face the TFT substrate, and a liquid crystal layer interposed between the TFT substrate and the opposite substrate. The TFT substrate has a plurality of pixels, and for each of the pixels, the aforementioned TFT and the pixel electrode are disposed. Also, on the TFT substrate, a driver that drives the plurality of pixels is formed in the non-display region. The semiconductor device 1 of an embodiment of the present invention constitutes this driver, for example.

On the surface of the glass substrate 11 of the semiconductor device 1, a lower layer gate electrode 13 is formed as the first conductive film. The lower layer gate electrode 13 is formed of an Mo film, for example, and has a thickness of about 100 nm. This allows the lower layer gate electrode 13 to function as a light-shielding film as well.

Over the glass substrate 11, a bottom gate insulating film 14 is formed to cover the lower layer gate electrode 13. The bottom gate insulating film 14 is formed of, for example, a $SiO_2$ film having a thickness of about 100 nm. Further, a base coat layer made of SiNO, for example, is preferably formed with a thickness of about 50 nm.

Over the glass substrate 11, a semiconductor layer 15 made of silicon is formed with a thickness of about 50 nm to cover the bottom gate insulating film 14. The semiconductor layer 15 is composed of a channel region 17, a source region 16, and a drain region 18 as the first conductive film. While a portion of the drain region 18 overlaps the lower layer gate electrode 13, other portion of the drain region 18 does not overlap the lower layer gate electrode 13.

Over the bottom gate insulating film 14, a gate insulating film 19 is formed to cover the semiconductor layer 15. The gate insulating film 19 is formed of $SiO_2$, for example, with a thickness of about 80 nm.

On the surface of the gate insulating film 19, a gate electrode 20 is formed to face the channel region 17 of the semiconductor layer 15. The gate electrode 20 is composed of an approximately 50 nm thick TaN and an approximately 400 nm thick W, which are layered on each other, for example.

Further, over the gate insulating film 19, a first interlayer insulating film 21 is formed to cover the gate electrode 20, the semiconductor layer 15, and the like. The first interlayer insulating film 21 is composed, for example, of a SiNx (silicon nitride) film, and formed with a thickness of about 250 nm. The first interlayer insulating film 21 has an irregular surface, and its height from the glass substrate 11 is the highest in the region where the gate electrode 20 is formed.

On the surface of the first interlayer insulating film 21, a planarizing film 22, which planarizes the surface irregularity of the first interlayer insulating film 21, is layered. The planarizing film 22 is composed of a photosensitive SOG film, for example, and has a thickness of about 600 nm when it is applied. The planarizing film 22 may be formed of a photosensitive resin instead of an SOG film.

A first contact hole 23 is formed in the planarizing film 22 and the first interlayer insulating film 21. The first contact hole 23 runs through the planarizing film 22, and extends from the planarizing film 22 to a portion of the first interlayer insulating film 21. That is, the bottom portion of the first contact hole 23 is formed in the first interlayer insulating film 21.

Here, the first contact hole 23 needs to pass through at least the planarizing film 22. However, from the perspective of reducing the etching damage that films formed between the first interlayer insulating film 21 and the glass substrate 11 (semiconductor layer 15 and the like), the first contact hole 23 is preferably formed to extend from the planarizing film 22 to a portion of the first interlayer insulating film 21.

On the surfaces of the planarizing film 22 and the first interlayer insulating film 21, a second interlayer insulating film 24 is formed. The second interlayer insulating film 24 covers the surface of the planarizing film 22 and the inner surface of the first contact hole 23. The second interlayer insulating film 24 is composed of a SiNx film, for example, and has a thickness of about 50 nm. Because the second interlayer insulating film 24 is relatively thin, it is formed along the inner surface of the first contact hole 23.

Further, on the surface of the second interlayer insulating film 24, a third interlayer insulating film 25 is layered. The third interlayer insulating film 25 is composed of $SiO_2$, for example, and has a thickness of about 700 nm. The surface of the third interlayer insulating film 25 is formed flat at least in a region where the planarizing film 22 and the gate electrode 20 are formed.

A second contact hole 26 having a small diameter than the first contact hole 23 is formed inside the first contact hole 23. The second contact hole 26 is formed to pass through the third interlayer insulating film 25, the second interlayer insulating film 24, and the first interlayer insulating film 21. The second contact hole 26 to the right in FIG. 1 further passes through the gate insulating film 19, and reaches the surface of the drain region 18 of the semiconductor layer 15. On the other hand, the second contact hole 26 to the left in FIG. 1 further runs through the gate insulating film 19 and the bottom gate insulating film 14, and reaches the surface of the lower layer gate electrode 13.

On the third interlayer insulating film 25 and inside the second contact hole 26, a drain wiring 27 and a lower layer gate wiring 28 are formed as a second conductive film. The drain wiring 27 is electrically connected to the drain region 18 of the semiconductor layer 15 via the second contact hole 26, while the lower layer gate wiring 28 is electrically connected to the lower layer gate electrode 13 via the second contact hole. The drain wiring 27 and the lower layer gate wiring 28 are formed, for example, of a metal layer containing aluminum.

In the region where the gate electrode 20 is formed, a third contact hole 29 is formed, which passes through the third interlayer insulating film 25, the second interlayer insulating film 24, and the first interlayer insulating film 21 to reach the surface of the gate electrode 20. On the third interlayer insulating film 25 and inside the third contact hole 29, an upper layer gate wiring 30 is formed as the third conductive film. In this way, the upper layer gate wiring 30 is electrically connected to the gate electrode 20 via the third contact hole 29.

This way, a plurality of wiring layers formed in the semiconductor device 1, i.e., the upper layer gate wiring 30, the drain wiring 27, and the lower layer gate wiring 28, are respectively planarized on the third interlayer insulating film 25.

Manufacturing Method

Next, a method for manufacturing the semiconductor device 1 is described with reference to FIGS. 1 to 5.

Figure 2:
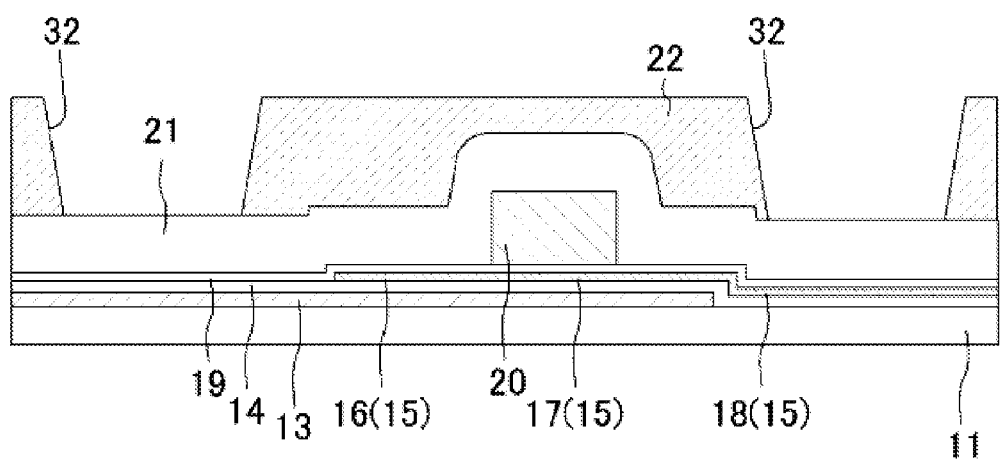
FIG. 2 is a cross-sectional view showing the planarizing film with a through hole formed in it.
Figure 3:
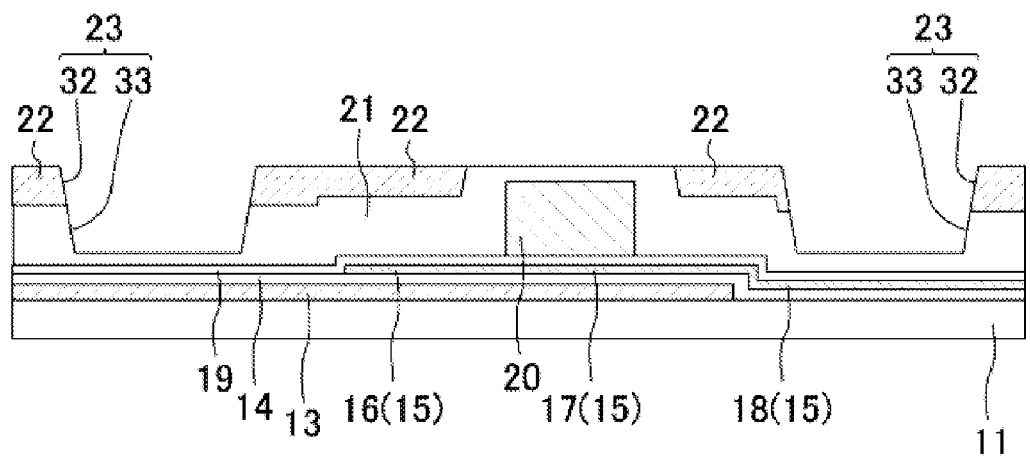
FIG. 3 is a cross-sectional view showing a first contact hole formed in the planarizing film and the first interlayer insulating film
Figure 4:
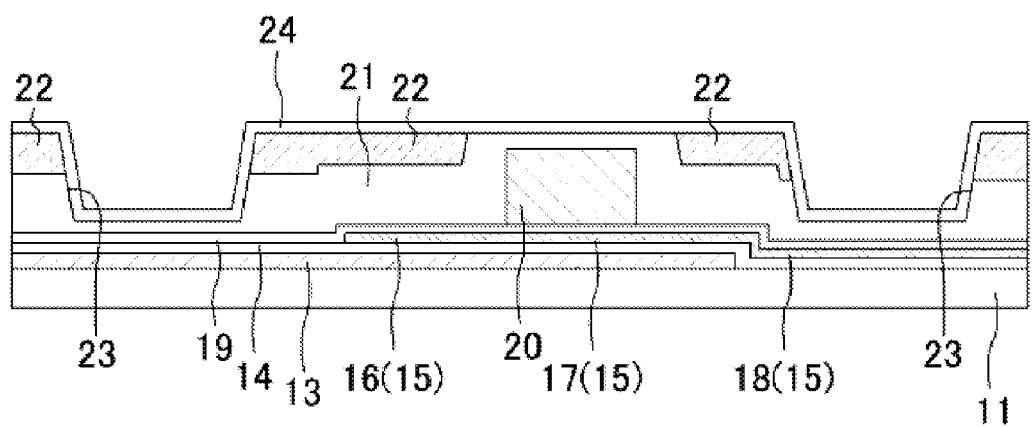
FIG. 4 is a cross-sectional view showing a second interlayer insulating film layered over the planarizing film and the first contact hole 3.
Figure 5:
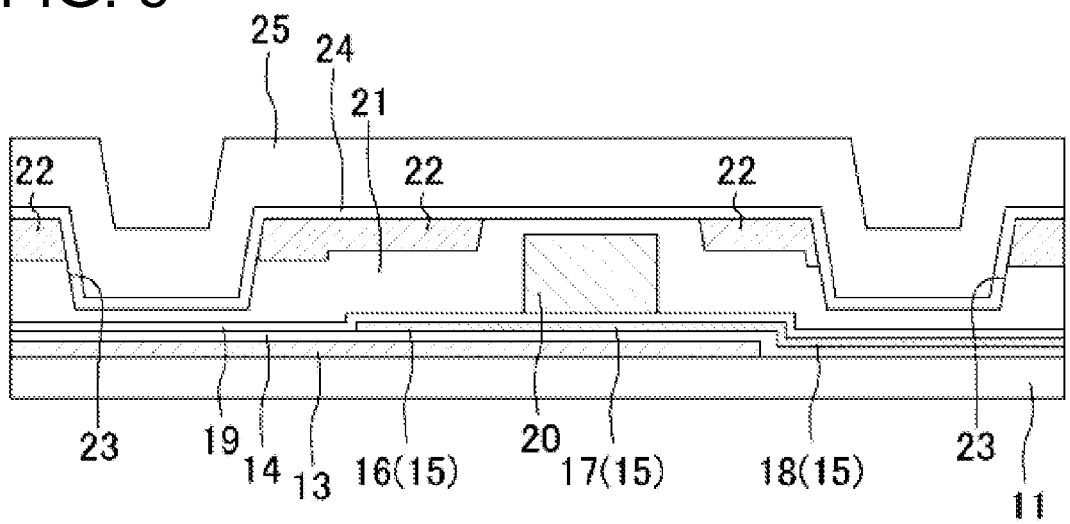
FIG. 5 is a cross-sectional view illustrating a third interlayer insulating film layered on the second interlayer insulating film.

Here, FIG. 2 is a cross-sectional view showing the planarizing film 22 in which a through hole 32 is formed. FIG. 3 is a cross-sectional view showing the first contact hole 23, which is formed in the planarizing film 22 and the first interlayer insulating film 21. FIG. 4 is a cross-sectional view showing the second interlayer insulating film 24, which is layered on the planarizing film 22 and the first contact hole 23. FIG. 5 is a cross-sectional view showing the third interlayer insulating film 25, which is layered on the second interlayer insulating film 24.

As shown in FIG. 2, a lower layer gate electrode 13 made of an Mo film is formed on the glass substrate 11 by sputtering or the like to provide a thickness of about 100 nm. Next, a $SiO_2$ film having a thickness of about 100 nm is formed to cover the lower layer gate electrode 13 to form a bottom gate insulating film 14. Further, preferably, a base coat layer made of SiNO, for example, is formed with a thickness of about 50 nm. Next, a semiconductor layer 15 is formed of silicon with a thickness of about 50 nm. Pattering of these respective films is conducted by photolithography.

Next, a gate insulating film 19 is formed of SiO2 with a thickness of about 80 nm. After that, a TaN having a thickness of 50 nm and a W having a thickness of 400 nm are layered over the surface of the gate insulating film 19 to form a gate electrode 20. Then, using the gate electrode 20 as a mask, an impurity element is doped into the semiconductor layer 15 to form a source region 16, a channel region 17, and a drain region 18.

Next, a SiNx film is deposited to a thickness of 250 nm over the gate insulating film 19, covering the gate electrode 20, semiconductor layer 15, and the like to form a first interlayer insulating film 21. The surface of the first interlayer insulating film 21 has a convex form, reflecting the shape of the gate electrode 20, which significantly protrudes from the surrounding area.

Subsequently, a photosensitive SOG film is applied on the surface of the first interlayer insulating film 21 to form a planarizing film 22. Next, a process to form the first contact hole 23 is conducted. In this process, which includes a first etching process and a second etching process, a first contact hole 23 is formed in such a manner as to extend from the planarizing film 22 to the first interlayer insulating film 21.

In the first etching process, as shown in FIG. 2, only the planarizing film 22 is etched in the region where the first contact hole 23 is to be formed, and consequently a through hole 32 is formed. That is, the planarizing film 22 is exposed through a mask, which is not illustrated, to form a through hole 32 that runs through the planarizing film 22 in a region where the first contact hole 23 is to be formed. The inner diameter of the through hole 32 is made larger than that of the second contact hole 26, which is to be formed later.

A decolorization treatment is conducted on the SOG film of the planarizing film 22 to improve the transmittance. Also, for the region of the SOG film in which the through hole 32 is formed, a hydrogenation treatment, which also cures the SOG film, is conducted.

Next, in the second etching process, as shown in FIG. 3, the first interlayer insulating film 21, which is exposed at the bottom of the through hole 32 and the planarizing film 22 around the through hole 32 are simultaneously etched back by dry etching. Here, the surface of the first interlayer insulating film 21, which has a convex form over the gate electrode 20, is also etched together with the surrounding planarizing film 22 to provide a flat surface. For the etching back, a gas with sufficiently high selectivity against the silicon film ($C_4F_8$, $CHF_3$, or the like) is used. This way, a first contact hole 23 is formed of the through hole 32 and a recess 33 of the first interlayer insulating film 21 formed therebelow.

Next, after the surfaces of the planarizing film 22 and the first interlayer insulating film 21 are cleaned to remove impurities, a SiNx film is formed on the surfaces, as shown in FIG. 4, to form a second interlayer insulating film 24. The second interlayer insulating film 24 is formed with a thickness of 50-100 nm to fully cover the inner surface of the first contact hole 23.

Subsequently, as shown in FIG. 5, a $SiO_2$ film is layered on the surface of the second interlayer insulating film 24 to form a third interlayer insulating film 25. Here, in the region where the first contact hole 23 is formed, the surface of the third interlayer insulating film 25 sags downward along with the shape of the first contact hole 23.

Next, inside the first contact hole 23, as shown in FIG. 1, second contact holes 26 are formed with a smaller inner diameter than the first contact hole 23. The second contact holes 26 are formed by etching to pass through the third interlayer insulating film 25, the second interlayer insulating film 24, the first interlayer insulating film 21, and the gate insulating film 19 (and furthermore, the bottom gate insulating film 14). Also, in the region where the gate electrode 20 is formed, a third contact hole 29 is formed by etching to pass through the third interlayer insulating film 25, the second interlayer insulating film 24, and the first interlayer insulating film 21.

Subsequently, as shown in FIG. 1, wiring layers 27, 28, and 30 are respectively formed. That is, on the third interlayer insulating film 25 and inside the second and third contact holes 26 and 29, a metal material including aluminum is formed, and the metal material layer is patterned by photolithography to form a drain wiring 27, a lower layer gate wiring 28, and an upper layer gate wiring 30. As a result, the drain wiring 27 is electrically connected to the drain region 18 of the semiconductor layer 15, while the lower layer gate wiring 28 is electrically connected to the lower layer gate electrode 13. Further, the upper layer gate wiring 30 is electrically connected to the gate electrode 20. This way, the semiconductor device 1 is manufactured.

Effects of Embodiments

Therefore, according to this embodiment, wiring layers 27, 28, and 30 on the third interlayer insulating film 25 can be formed as planarized, while the semiconductor device 1 is highly integrated. Additionally, both the surface of the planarizing film 22 made of an SOG film and the side surface of the planarizing film 22 that constitutes the inner surface of the first contact hole 23 can be covered by a single second interlayer insulating film (SiNx) 24, and with the second interlayer insulating film (SiNx) 24, impurity release from the planarizing film (SOG film) 22 can be prevented. As a result, oxidation of the wiring layers 27 and 28 inside the first contact hole 23 can reliably be prevented.

Furthermore, because the second contact hole 26 is formed inside the first contact hole 23 that has a greater inner diameter, when the second contact hole 26 is formed, its aspect ratio can be lowered to reduce the etching damage on the drain region 18 of the semiconductor layer 15 and the lower layer gate electrode 13. Also, over-etching can be suppressed by shortening the etching time, and therefore the second contact hole 26 can suitably be miniaturized.

Figure 6:
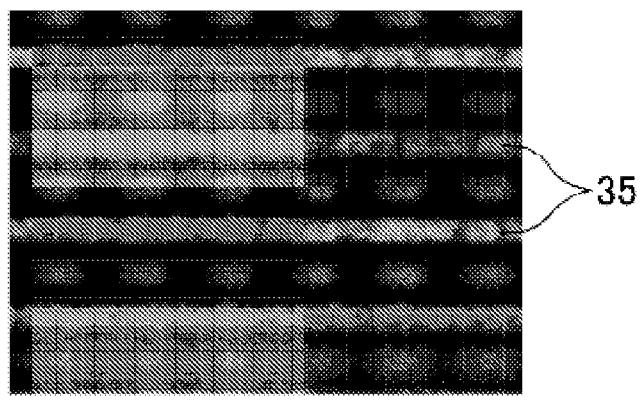
FIG. 6 is a plan view illustrating a plurality of wiring layers that were actually formed as an embodiment example.
Figure 7:
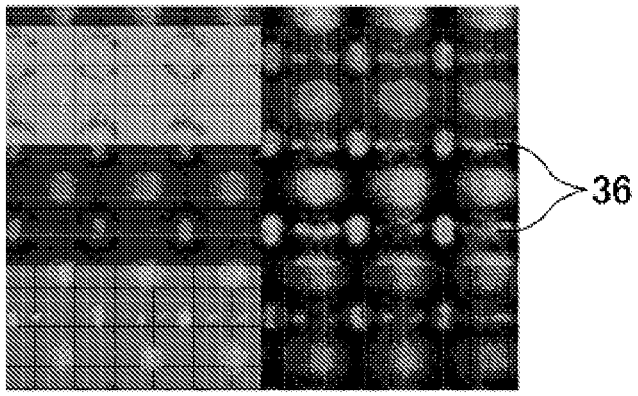
FIG. 7 is a plan view illustrating a conventional example of the wiring layer, which is formed without planarization.

FIG. 6 is a plan view showing a plurality of wiring layers 35, which is an embodiment example that was actually manufactured in a manner described above. FIG. 7 is a plan view showing the wiring layer 36 of a conventional example, which was formed without planarization. In the conventional example, as shown in FIG. 7, the pattern of the wiring layer 36 is formed with irregular width. According to an embodiment of the present invention, as shown in an embodiment example of FIG. 6, the width of the wiring layer 35 can be made precise and uniform.

Figure 8:
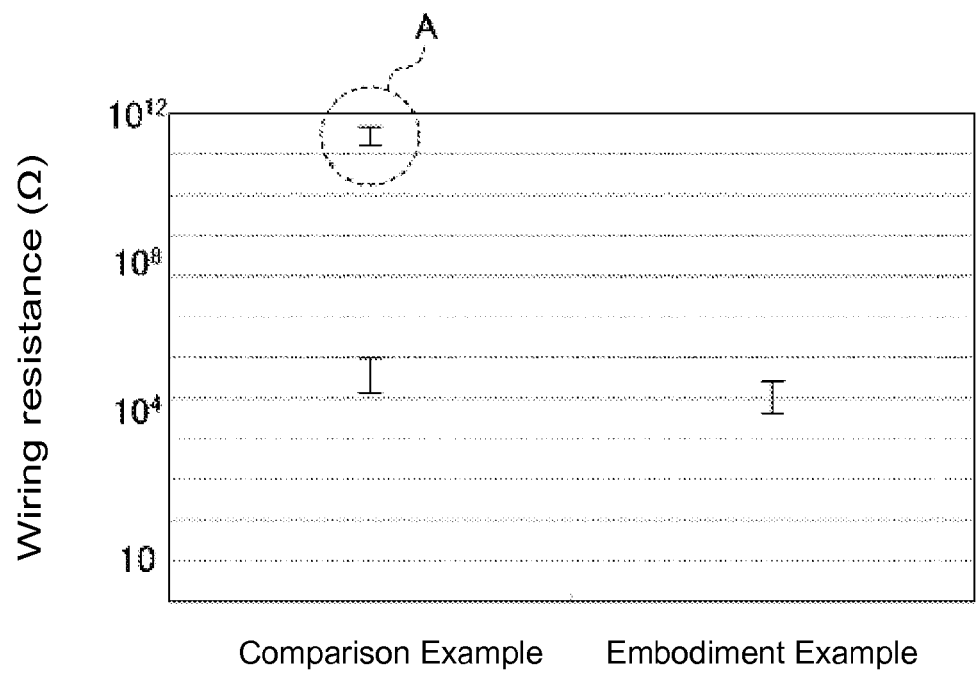
FIG. 8 is a graph that shows the measurement results of wiring resistance at multiple locations for an unplanarized comparison example and for a planarized embodiment example.
Figure 9:
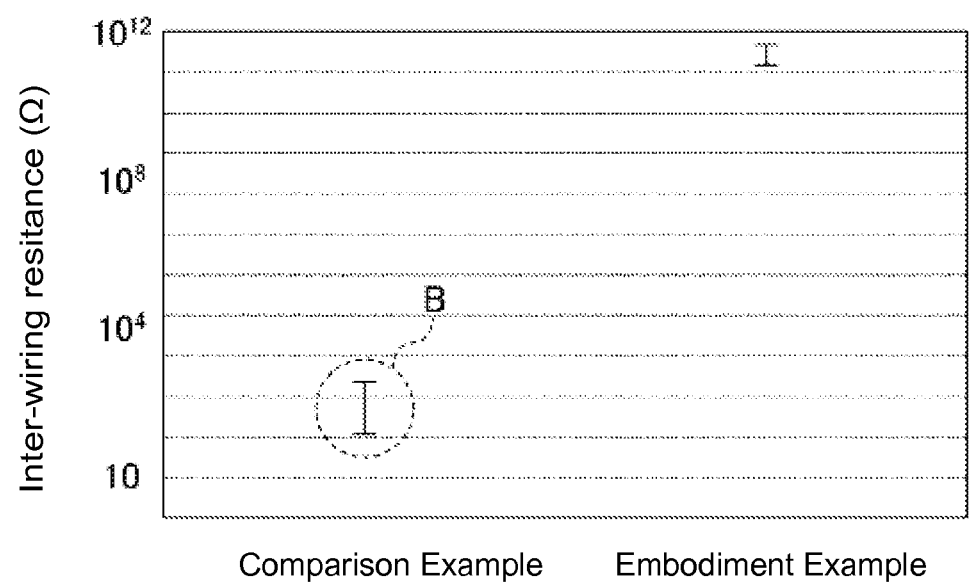
FIG. 9 is a graph that shows the measurement results of inter-wiring resistance at multiple locations for an unplanarized comparison example and for a planarized embodiment example.
Figure 10:
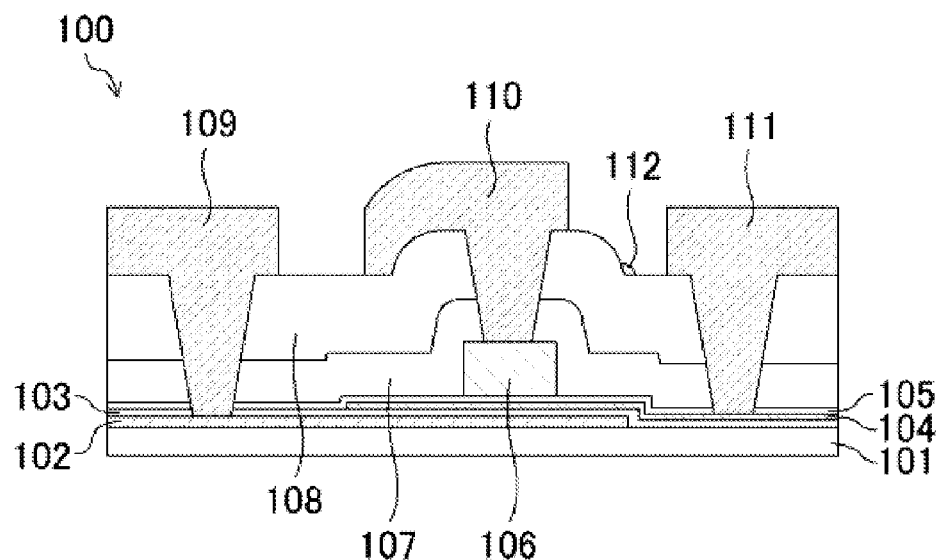
FIG. 10 is an enlarged cross-sectional view that shows a part of a conventional TFT substrate.
Figure 11:
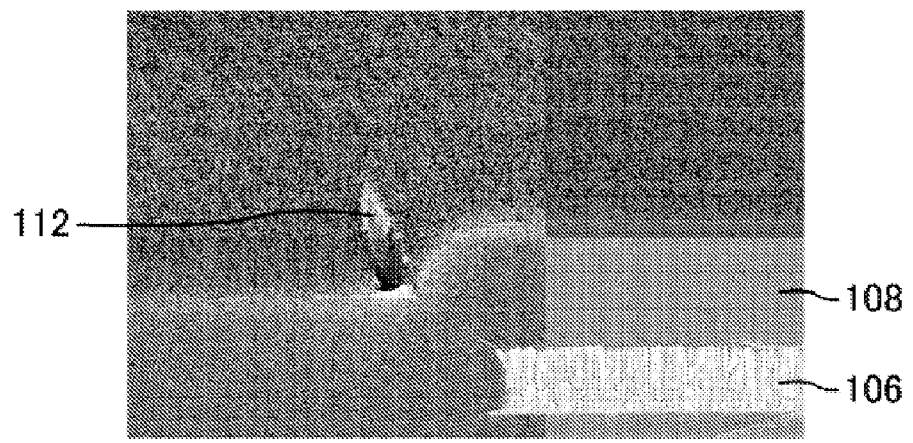
FIG. 11 is a photograph showing an enlarged view of residue formed on a conventional second interlayer insulating film.
Figure 12:
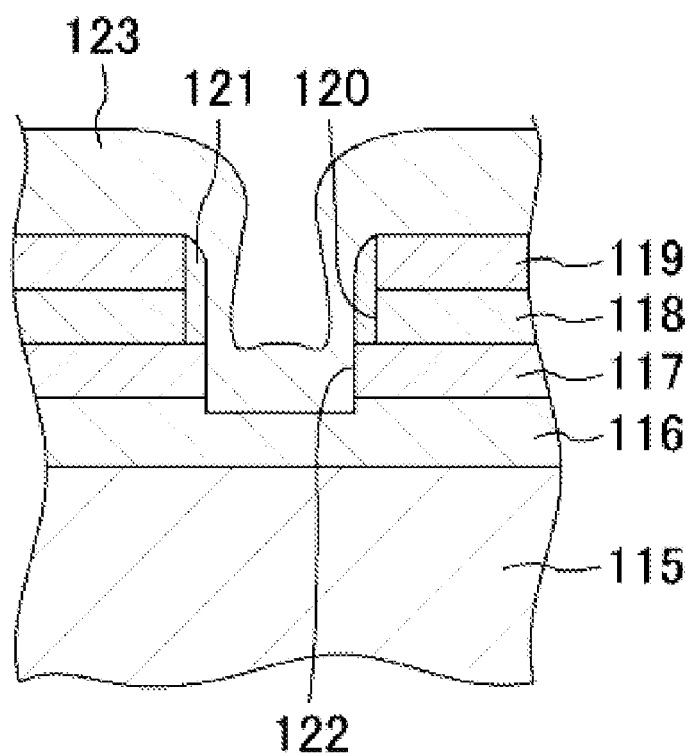
FIG. 12 is a cross-sectional view that shows the structure of a conventional via hole.

FIG. 8 is a graph that shows the measurement results of wiring resistance at multiple locations for an unplanarized comparison example and for a planarized embodiment example. FIG. 9 is a graph that shows the measurement results of inter-wiring resistance at multiple locations for the aforementioned comparison example and for the aforementioned embodiment example.

For the wiring layers 36 of the comparison example, as indicated by a dotted line A in FIG. 8, the wiring resistance was high in certain multiple regions, and therefore the presence of broken wiring was confirmed. On the other hand, for the wiring layers 35 of the embodiment example, wiring resistance was relatively small in all measurements, and therefore the absence of broken wiring was confirmed.

For the wiring layer 36 of the comparison example, as indicated by the dotted line B in FIG. 9, the inter-wiring resistance was smaller compared to the wiring layer 35 of the embodiment example, and therefore the presence of leakage between the wiring layers 36 was suggested. On the other hand, for the wiring layer 35 of the embodiment example, inter-wiring resistance remained high in all measurements, and therefore the absence of broken wiring was confirmed.

INDUSTRIAL APPLICABILITY

As described above, the present invention is useful for semiconductor devices for use in a liquid crystal display device or the like, for example, and for a method of manufacturing such semiconductor devices.

DESCRIPTION OF REFERENCE CHARACTERS

1 semiconductor device
3 first contact hole
11 glass substrate (insulating substrate)
12 MOS transistor
13 lower layer gate electrode (first conductive film)
15 semiconductor layer
18 drain region (first conductive film)
21 first interlayer insulating film
22 planarizing film
23 first contact hole
24 second interlayer insulating film
25 third interlayer insulating film
26 second contact hole
27 drain wiring (second conductive film)
28 lower layer gate wiring (second conductive film)
32 through hole

The invention claimed is:

1. A semiconductor device, comprising:
   a first conductive film formed on an insulating substrate;
   a first interlayer insulating film that covers said first conductive film;
   a planarizing film layered over said first interlayer insulating film;
   a first contact hole that passes through said planarizing film;
   a second interlayer insulating film that covers a surface of said planarizing film and an inner surface of said first contact hole;
   a third interlayer insulating film layered over said second interlayer insulating film;
   a second contact hole formed inside said first contact hole with a smaller inner diameter than said first contact hole to pass through said first interlayer insulating film, said second interlayer insulating film, and through said third interlayer insulating film; and
   a second conductive film formed over said third interlayer insulating film and inside said second contact hole to be electrically connected to said first conductive film.

2. The semiconductor device according to claim 1, wherein said first contact hole is formed to extend from said planarizing film to a portion of said first interlayer insulating film.

3. The semiconductor device according to claim 1, wherein said planarizing film is composed of an SOG film.

4. The semiconductor device according to claim 1, wherein said second interlayer insulating film is composed of a silicon nitride film.

5. The semiconductor device according to claim 1, wherein said first interlayer insulating film is composed of a silicon nitride film.

6. The semiconductor device according to claim 1, wherein said third interlayer insulating film is composed of $SiO_2$.

7. A method for manufacturing a semiconductor device, comprising:
   forming a first conductive film on an insulating substrate;
   forming a first interlayer insulating film over said insulating substrate to cover said first conductive film;
   forming a planarizing film on a surface of said first interlayer insulating film;
   forming a first contact hole that passes through said planarizing film;
   forming a second interlayer insulating film that covers a surface of said planarizing film and an inner surface of said first contact hole;
   layering a third interlayer insulating film on a surface of said second interlayer insulating film;
   forming a second contact hole inside said first contact hole with a smaller inner diameter than said first contact hole, said second contact hole passing through said first interlayer insulating film, said second interlayer insulating film, and through said third interlayer insulating film; and
   forming a second conductive film over said third interlayer insulating film and inside said second contact hole to electrically connect said second conductive film to said first conductive film.

8. The method for manufacturing a semiconductor device according to claim 7, wherein the step of forming said first contact hole includes forming said first contact hole so as to extend from said planarizing film to a portion of said first interlayer insulating film.

9. The method for manufacturing a semiconductor device according to claim 8, wherein the step of forming said first contact hole includes a first etching process in which, in a region where said first contact hole is to be formed, only said planarizing film is etched to form a through hole, and a second etching process in which said first interlayer insulating film exposed at a bottom of said through hole and a planarizing film around said through hole are etched simultaneously.

10. The method for manufacturing a semiconductor device according to claim 7, wherein said planarizing film is composed of an SOG film.

11. The method for manufacturing a semiconductor device according to claim 7, wherein said second interlayer insulating film is composed of a silicon nitride film.

12. The method for manufacturing a semiconductor device according to claim 7, wherein said first interlayer insulating film is composed of a silicon nitride film.

13. The method for manufacturing a semiconductor device according to claim 7, wherein said third interlayer insulating film is composed of $SiO_2$.

* * * * *